United States Patent [19]

Kuo

[11] Patent Number: 5,438,282
[45] Date of Patent: Aug. 1, 1995

[54] CMOS BTL COMPATIBLE BUS AND TRANSMISSION LINE DRIVER

[75] Inventor: James R. Kuo, Cupertino, Calif.

[73] Assignee: National Semiconductor Corporation, Santa Clara, Calif.

[21] Appl. No.: 356,784

[22] Filed: Dec. 12, 1994

Related U.S. Application Data

[63] Continuation of Ser. No. 73,534, Jun. 8, 1993, abandoned.

[51] Int. Cl.⁶ .................. H03K 17/16; H03K 19/0175
[52] U.S. Cl. ......................................... 326/86; 326/32
[58] Field of Search ................. 307/475, 443, 446; 326/86, 83, 32, 34

[56] References Cited

U.S. PATENT DOCUMENTS

| | | | |
|---|---|---|---|
| 3,333,113 | 7/1967 | Cole et al. | 307/88.5 |
| 4,080,539 | 3/1978 | Stewart | 307/75 |
| 4,254,501 | 3/1981 | Griffith et al. | 375/9 |
| 4,385,394 | 5/1983 | Pace | 375/36 |
| 4,393,494 | 7/1983 | Belforte et al. | 370/27 |
| 4,598,216 | 7/1986 | Lauffer et al. | 307/475 |
| 4,647,912 | 3/1987 | Bates et al. | 340/825.5 |
| 4,691,127 | 9/1987 | Huizer | 307/475 |
| 4,751,404 | 6/1988 | Yuen | 307/297 |
| 4,760,292 | 7/1988 | Bach | 307/475 |
| 4,763,021 | 8/1988 | Stickel | 307/475 |
| 4,774,422 | 9/1988 | Donaldson et al. | 307/475 |
| 4,825,402 | 4/1989 | Jalali | 364/900 |
| 4,845,388 | 7/1989 | Amatangelo | 307/475 |
| 4,849,661 | 7/1989 | Bazes | 307/475 |
| 4,855,622 | 8/1989 | Johnson | 307/456 |
| 4,855,623 | 8/1989 | Flaherty | 307/475 |
| 4,894,561 | 1/1990 | Nogami | 307/443 |
| 4,929,941 | 5/1990 | Lecocq | 340/825.14 |
| 4,937,476 | 6/1990 | Bazes | 307/475 |
| 4,965,469 | 10/1990 | Kondoh et al. | 307/475 |
| 4,972,106 | 11/1990 | Ruijs | 307/473 |
| 4,978,905 | 12/1990 | Hoff et al. | 323/314 |
| 4,980,579 | 12/1990 | McDonald et al. | 307/455 |
| 5,015,888 | 5/1991 | Ovens | 307/475 |

(List continued on next page.)

FOREIGN PATENT DOCUMENTS

| | | | |
|---|---|---|---|
| 0199374 | 10/1986 | European Pat. Off. | H03K 19/094 |
| 0351820 | 1/1990 | WIPO | H03K 19/017 |
| 0557080 | 8/1993 | European Pat. Off. | H03K 19/003 |
| 0575676 | 12/1993 | European Pat. Off. | H03K 19/00 |
| WO85/02507 | 6/1985 | WIPO | H03K 19/092 |
| WO85/04774 | 10/1985 | WIPO | H03K 19/086 |
| WO86/01055 | 2/1986 | WIPO | H03K 19/092 |
| WO89/00362 | 1/1989 | WIPO | H03K 19/094 |
| WO91/20129 | 12/1991 | WIPO | H03K 19/003 |

OTHER PUBLICATIONS

Bill Gunning, "GTL Fact Sheet", Sept. 20, 1991, all pages.

Paul R. Gray and Robert G. Meyer, "Analysis and Design of Analog Integrated Circuits", 1977, pp. 254–261.

(List continued on next page.)

*Primary Examiner*—Edward P. Westin
*Assistant Examiner*—Richard Roseen
*Attorney, Agent, or Firm*—Limbach & Limbach; H. Donald Nelson; Vince Pitruzzella

[57] ABSTRACT

A driver for providing binary signals from a data system to a transmission line is disclosed. The driver includes a first field-effect transistor (FET) coupled between an output node and ground for conducting current from the output node to ground. The output node is connectable to the transmission line. A first input stage conducts current from a first voltage supply to the gate of the first FET. The first input stage includes a voltage sensing amplifier for comparing a reference voltage to the voltage potential of the output node and for controlling the amount of current conducted to the gate of the first FET in response to the comparison. A second input stage conducts current from the gate of the first FET to ground. In an alternative embodiment, the driver includes a temperature compensation circuit coupled to the first and second input stages for adjusting the level of current conducted to the gate of the first FET and the level of current conducted from the gate of the first FET to compensate for variations in temperature.

18 Claims, 8 Drawing Sheets

U.S. PATENT DOCUMENTS

| | | |
|---|---|---|
| 5,017,813 | 5/1991 | Galbraith et al. ............... 307/475 |
| 5,019,728 | 5/1991 | Sanwo et al. ................... 307/475 |
| 5,021,684 | 6/1991 | Ahuja et al. ................... 307/443 |
| 5,023,487 | 6/1991 | Wellheuser et al. ............ 307/475 |
| 5,023,488 | 6/1991 | Gunning ........................ 307/475 |
| 5,034,623 | 7/1991 | McAdams ...................... 307/475 |
| 5,034,632 | 7/1991 | Jansson et al. ................ 307/456 |
| 5,038,058 | 8/1991 | Wang ............................ 307/475 |
| 5,041,743 | 8/1991 | Matsumoto .................... 307/455 |
| 5,070,256 | 12/1991 | Grondalski .................... 307/270 |
| 5,081,380 | 1/1992 | Chen ............................. 307/591 |
| 5,095,231 | 3/1992 | Sartori et al. ................. 307/475 |
| 5,097,148 | 3/1992 | Garbara ........................ 307/475 |
| 5,105,102 | 4/1992 | Shioda .......................... 307/475 |
| 5,117,130 | 5/1992 | Shoji ............................. 307/443 |
| 5,118,971 | 6/1992 | Schenck ........................ 307/443 |
| 5,165,046 | 11/1992 | Hesson .......................... 307/270 |
| 5,208,492 | 5/1993 | Masumoto et al. ............ 307/469 |
| 5,218,239 | 6/1993 | Boomer ......................... 307/443 |
| 5,241,221 | 8/1993 | Fletcher et al. ............... 307/263 |
| 5,254,883 | 10/1993 | Horowitz et al. ............. 307/443 |
| 5,285,116 | 2/1994 | Thaik ............................ 307/443 |
| 5,291,071 | 3/1994 | Allen et al. ................... 307/270 |
| 5,293,082 | 3/1994 | Bathaee ........................ 307/270 |
| 5,296,756 | 3/1994 | Patel et al. ................... 307/443 |
| 5,304,861 | 4/1994 | Fruhauf et al. ............... 307/296.4 |
| 5,313,118 | 5/1994 | Lundberg ...................... 307/451 |
| 5,315,174 | 5/1994 | Chang et al. ................. 307/443 |
| 5,319,258 | 6/1994 | Ruetz ............................ 307/443 |
| 5,329,184 | 7/1994 | Redfern ........................ 307/475 |
| 5,334,882 | 8/1994 | Ting .............................. 307/270 |
| 5,338,987 | 8/1994 | Tomasetti et al. ............ 307/570 |

OTHER PUBLICATIONS

"Electronically Switchable Interface Circuit With Multiple EIA Protocol Drivers and Receivers", IBM Technical Disclosure Bulletin, vol. 30, No. 11, Apr. 1988, all pages.

Boris Bertolucci, "Fastbus Dual-Port Memory and Display Diagnostic Module", IEEE Transactions on Nuclear Science, vol. NS-34, No. 1, Feb. 1987, pp. 253–257.

National Semiconductor Corporation, "DS36950 Quad Differntial Bus Transceiver", Interface Databook, 1990 Edition, pp. 1-123 to 1-131.

National Semiconductor Corporation, "DS3886 BTL 9-Bit Latching Data Transceiver", High Performance Bus Interface Designer's Guide, 1991 Edition, pp. 1-74 to 1-80.

National Semiconductor Corporation, "DS3883 BTL 9-Bit Data Transceiver", High Performance Bus Interface Designer's Guide, 1991 Edition, pp. 1-58 to 1-62.

| C1 | C2 | VGM70 | VGM72 | VGM74 | VGM76 |
|----|----|-------|-------|-------|-------|
| 0  | 0  | 0     | 0     | 0     | 1     |
| 0  | 1  | 0     | 0     | 1     | 0     |
| 1  | 0  | 0     | 1     | 0     | 0     |
| 1  | 1  | 1     | 0     | 0     | 0     |

5,438,282

CMOS BTL COMPATIBLE BUS AND TRANSMISSION LINE DRIVER

This is a continuation of application Ser. No. 08/073,534 filed on Jun. 8, 1993, now abandoned.

RELATED APPLICATIONS

This application is related to the following copending applications that were all filed of even date herewith and are commonly assigned with this application to National Semiconductor Corporation of Santa Clara, Calif.: U.S. Ser. No. 08/073,939 titled "Programmable CMOS Current Source Having Positive Temperature Coefficient" by James Kuo; U.S. Ser. No. 08/073,304 titled "CMOS Bus and Transmission Line Driver Having Compensated Edge Rate Control" by James Kuo; U.S. Ser. No. 08/073,679 titled "Programmable CMOS Bus and Transmission Line Driver" by James Kuo; and, U.S. Ser. No. 08/073,927 titled "Programmable CMOS Bus and Transmission Line Receiver" by James Kuo. The above-referenced applications are hereby incorporated by reference to provide background information regarding the present invention.

BACKGROUND OF THE INVENTION

1. Field of the Invention

The present invention relates to line interface devices, and, in particular, to a CMOS driver meeting the standard for Backplane Transceiver Logic (BTL) that is used for interfacing CMOS digital circuits to transmission lines.

2. Description of the Related Art

Digital systems typically include several Very Large Scale Integrated (VLSI) circuits that cooperate and communicate with one-another to perform a desired task. FIG. 1 illustrates a typical digital system. The VLSI circuits are mounted on several circuit boards that are referred to as "daughter boards". Each daughter board may accommodate several VLSI circuits. In turn, the daughter boards are received by a "mother board" that has circuitry for facilitating communication between the individual daughter boards.

The individual VLSI circuits are interconnected for binary communication by transmission mediums. The transmission mediums are generally collected together to form buses. The number, size and types of buses that are used in a digital system may be designed for general-purpose applications or according to a more specific, industry standard data-communications configuration. One such industry standard is the so-called IEEE 896.1 Futurebus+ standard. The Futurebus+ standard provides a protocol for implementing an internal computer bus architecture.

FIG. 1 illustrates the hierarchy of the several different bus levels utilizable in a Futurebus+ system. A "component level bus" is used to interconnect the several VLSI circuits that are located on a single daughter board, and a "backplane bus" is used to interconnect the VLSI circuits of one daughter board to the VLSI circuits of another daughter board. Thus, a component level bus is constructed on each daughter board, and a backplane bus is constructed on the mother board.

The transmission mediums which form the component and backplane buses are typically traces which are formed on the printed circuit board (PCB) substrates of the daughter and mother boards. Microstrip traces and strip line traces can be employed to form transmission lines having characteristic impedances on the order of about 50Ω–70Ω. Such transmission lines usually have their opposite ends terminated in their characteristic impedance. Because of these parallel resistive terminations, the effective resistance of the transmission line may be as low as 25Ω–35Ω.

Data transceivers (TRANSmitter/reCEIVER) are used to interface the VLSI circuits to the transmission medium. FIG. 2 illustrates the positioning of a data transceiver between the backplane bus of a Futurebus+ system and the data bus of a VLSI circuit to facilitate communications between the VLSI circuit and the rest of the digital system.

A data transceiver is a read/write terminal capable of transmitting information to and receiving information from the transmission medium. A transceiver typically includes a line driver stage (or simply "driver") and a receiver stage (or simply "receiver"). The common purpose of transmission line drivers and receivers is to transmit data quickly and reliably through a variety of environments over electrically long distances. This task is complicated by the fact that externally introduced noise and ground shifts can severely degrade the data.

Drivers amplify digital signal outputs from the VLSI circuitry so that the signals can be properly transmitted on the transmission medium. Receivers are typically differential amplifiers that receive signals from the transmission medium and provide outputs to the VLSI circuitry that are representative of digital information received from the medium.

Conventional drivers usually include level shifting capability to provide compatibility with different integrated circuit technologies. Specifically, before a driver transmits a signal across a transmission medium, the driver changes the nominal voltage swing (or the "dynamic signal range") utilized by the VLSI circuitry, e.g., CMOS, TTL, ECL, etc., to a different voltage swing that is utilized by the transmission medium. Thus, a driver not only amplifies a digital signal, but it changes the nominal voltage swing of the signal as well.

A different nominal voltage swing is normally used when transmitting data across a transmission medium in order to conserve power. Specifically, the power internally dissipated by the driver is proportional to the nominal voltage swing of the binary signal it applies to the transmission line. Therefore, power dissipation is reduced if the driver transmits a signal having a relatively small voltage swing over the transmission line.

It has become common for signals to be transmitted over transmission lines at BTL (Backplane Transceiver Logic) signal levels. The signal level standard is denoted "Backplane" because BTL has been used primarily in the backplane buses of mother boards. Because the nominal voltage swing of BTL is 1.0 Volt (logic low) to 2.1 Volts (logic high), power dissipation is less than it would be if the signals were transmitted over the transmission lines at CMOS (0 Volts to 3.3 Volts, or, 0 Volts to 5.0 Volts) or TTL (0 volts to 3.5 Volts) signal levels.

Signals have also been transmitted over transmission lines at the so-called "GTL" signal levels (See U.S. Pat. No. 5,023,488 to Gunning). The nominal voltage swing of GTL is approximately 0.3 Volts (logic low) to 1.2 Volts (logic high).

FIG. 3 illustrates a conventional BTL driver 20. The driver 20 receives CMOS level signals at input $V_{IN}$ and outputs BTL level signals at output $V_{OUT}$. The driver 20 is implemented with bipolar transistors Q1, Q2, Q3, Q4, and Q5. Bipolar technology is attractive for implementing I/O devices, such as line or bus drivers, because of its unique high current gain characteristic. High current gain is important in a bus system such as future bus backplane because the driver 20 must be capable of driving the transmission line in both unloaded and loaded conditions.

In order to determine the current $I_{DU}$ that must be generated by the driver 20 to drive an unloaded transmission line, the impedance $Z_U$ of the unloaded transmission line must be considered. As mentioned above, both ends of the bus are typically terminated with bus characteristic impedance $Z_o$ (typically 50 Ω). Thus, because of the parallel bus end terminations, the impedance $Z_U$ of the unloaded backplane bus is approximately:

$$
\begin{aligned}
Z_U &= (Z_o)(Z_o)/(Z_o + Z_o) \\
&= Z_o/2 \\
&= 50/2 \\
&= 25 \, \Omega.
\end{aligned}
$$

In order for the driver 20 to transmit data over the unloaded backplane bus, the driver 20 should be capable of transmitting a current $I_{DU}$ approximately equal to:

$$
\begin{aligned}
I_{DU} &= \Delta V_{OUT}/Z_U \\
&= (V_T - V_{OL})/Z_U \\
&= (2.1 - 1.1)/25 \\
&= 40 \, mA;
\end{aligned}
$$
where, $$
\begin{aligned}
V_T &= BTL \text{ "high"} = 2.1 \text{ Volts; and} \\
V_{OL} &= BTL \text{ "low"} = 1.0 \text{ Volts.}
\end{aligned}
$$

In order to determine the current $I_{DL}$ that must be generated by the driver 20 to drive a loaded transmission line, the impedance $Z_L$ of the loaded transmission line must be considered. When the backplane bus is uniformly loaded with the capacitance of plugged-in daughter boards at frequent intervals, the impedance $Z_L$ of the loaded backplane bus is given by:

$$Z_L = (Z_o/2)/\sqrt{1 + (C_L/C)} \; ;$$

where, $C$ = the unloaded bus distributed capacitance per unit length
$\approx (20 \, pF + 4 \times 10^1 \, pF)$
$\approx 60 \, pF/ft$ (pF = pico-Farad);

and, $C_L$ = the distributed load capacitance per unit length (including transceivers, pc traces and connectors).

For a system such as IEEE 896 which has 10 slots per foot, $C_L$ is approximately equal to:

$$C_L = 10 \times 10 = 100 \, pF/ft;$$

and, $Z_L$ is approximately equal to:

$$Z_L = 25/\sqrt{1 + \frac{100}{60}} = \frac{25}{1.633} = 15.31 \, \Omega.$$

The drive current required to drive the loaded backplane bus is approximately equal to:

$$I_{DL} = \frac{(2.1 - 1.1)}{15.31} = 65 \, mA.$$

Therefore, the BTL driver 20 must generate approximately 40 mA to drive an unloaded backplane bus and approximately 65 mA to drive a loaded backplane bus. Due to its high current gain, the bipolar NPN transistor Q1 seems particularly suited to be the driving device of the BTL driver 20.

Although the BTL driver 20 is capable of generating the current required to drive a backplane bus, it suffers from a number of disadvantages due to its bipolar construction.

First, because of the large collector capacitance of transistor Q1, a blocking schottky diode D1 is required in order to reduce the driver 20 output capacitance to less than 2.0 pF.

Second, the driver 20 output $V_{OUT}$ has a very fast rising and falling edge. Without control, the fast rising and falling edge can create ground bouncing, output over/under shoot, and cross-talk between bus conductors. These adverse effects can significantly reduce a receiver's noise margin. In order to control the adverse effects that can be caused by a fast rising and falling edge, Futurebus+ specifies a minimum rise-time $t_r$ and fall-time $t_f$ 1 nano-second measured between 20% to 80% of the voltage swing levels.

In order to meet the Futurebus+ specifications with respect to $t_r$ and $t_f$, the BTL driver 20 uses a miller capacitor $C_M$ between the collector of transistor Q1 and the base of transistor Q2 to increase $t_f$. Specifically, $t_f$ is given by:

$$t_f = \frac{C_M}{I_{bQ2}} \Delta V_{OUT};$$

where $I_{bQ2}$ is the base current of transistor Q2. Similarly, the BTL driver 20 uses the capacitance $C_{ob}$ at the collector-base junction of transistor Q1 to control $t_r$. Specifically, $t_r$ is given by:

$$t_r = \frac{C_{ob}}{I_{bQ1}} \Delta V_{OUT};$$

where $I_{bQ1}$ is the base current of transistor Q1. The problem with controlling $t_f$ and $t_r$ in this manner, however, is that both $I_{bQ2}$ and $I_{bQ1}$ are supply voltage and temperature dependant. When temperature decreases and the supply voltage increases, $I_{bQ2}$ and $I_{bQ1}$ both increase which results in a decrease in $t_r$ and $t_f$. Thus, the $t_r$ and $t_f$ of the BTL driver 20 are difficult to control during variations in temperature and supply voltage. If not controlled, $t_r$ and $t_f$ could fall below the Futurebus+ minimum specifications.

Another disadvantage of the bipolar BTL driver 20 is the skew between its turn-on and turn-off delay. When temperature increases and supply voltage increases, the increase in the base turn-on current $I_{bQ1ON}$ and current gain of transistor Q1 significantly increases transistor Q1's base over-drive. An increase in temperature of 100° C. can increase the base turn-on current $I_{bQ1ON}$ and current gain of transistor Q1 by 100%. Such an increase in transistor Q1's base over-drive causes $t_r$, and thus, turn-on time, to get much shorter.

However, the increase in the base turn-on current $I_{bQ1ON}$ of transistor Q1 due to the temperature and supply voltage increases causes more storage charge to accumulate in transistor Q1's collector and base region. The accumulation of storage charge causes the base turn-off current $I_{bQ1OFF}(V_{BEQ1}/R1)$ of transistor Q1 to decrease, and the decrease in $I_{bQ1OFF}$ causes $t_f$ and the turn-off time of transistor Q1 to be very long. Therefore, the skew between the turn-on and turn-off times tends to get worse as temperature and supply voltage increase.

Other disadvantages of the BTL driver 20 due to its bipolar implementation are high power dissipation and the inefficiency of large scale integration due to lower gate density and higher cost. These disadvantages would also be present in a BiCMOS implementation.

Thus, there is a need for a BTL driver that overcomes the disadvantages of the conventional bipolar BTL driver discussed above.

SUMMARY OF THE INVENTION

The present invention provides a driver for providing binary signals from a data system to a transmission line. The driver includes a first field-effect transistor (FET) coupled between an output node and ground for conducting current from the output node to ground. The output node is connectable to the transmission line. A first input stage conducts current from a first voltage supply to the gate of the first FET. The first input stage includes a voltage sensing amplifier for comparing a reference voltage to the voltage potential of the output node and for controlling the amount of current conducted to the gate of the first FET in response to the comparison. A second input stage conducts current from the gate of the first FET to ground.

In an alternative embodiment, the driver includes a temperature compensation circuit coupled to the first and second input stages for adjusting the level of current conducted to the gate of the first FET and the level of current conducted from the gate of the first FET to compensate for variations in temperature.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

Figure 4:
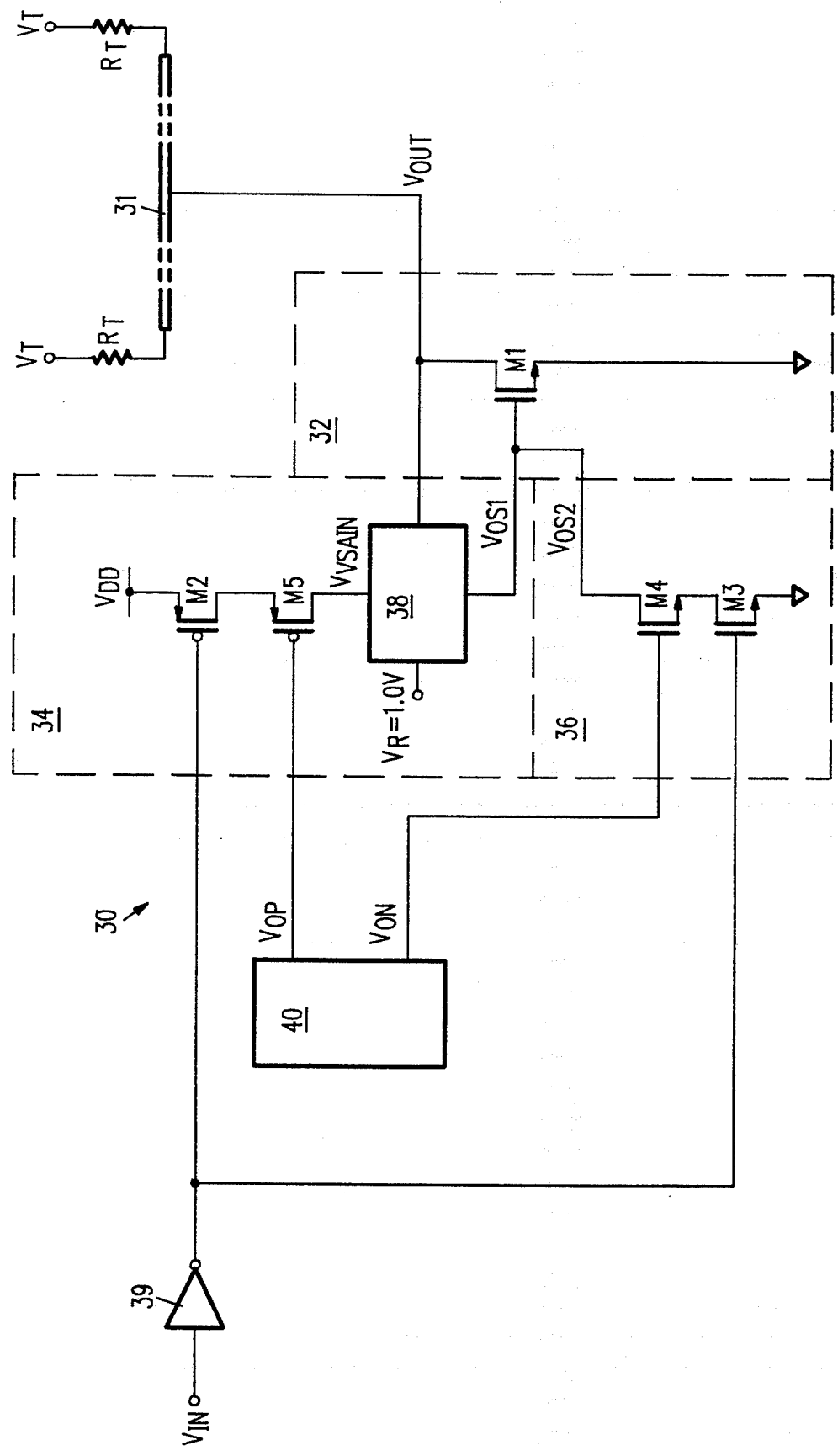
FIG. 4 is a schematic diagram illustrating a CMOS BTL transmission line driver in accordance with the present invention.

FIG. 4 shows a CMOS BTL driver 30 in accordance with the present invention. The driver 30 is used for transferring data signals generated by a data system, such as a VLSI circuit, to a transmission medium. The driver 30 includes level shifting capability so that the data signals fed to the transmission medium operate within a transmission dynamic signal range. For the embodiment of the invention described herein, the transmission dynamic signal range utilized by the transmission medium is the Backplane Transceiver Logic (BTL) standard.

The driver 30 is implemented with n-channel and p-channel field-effect transistors (FETs), i.e., it is a CMOS device and utilizes no bipolar transistors. The CMOS implementation overcomes the problems associated with large scale integration of the bipolar driver 20 described above, i.e., low gate density and high cost.

The driver 30 is designed to receive CMOS level binary signals, i.e., digital signals having a voltage swing of approximately 0 Volts (logic low) to 3.3 Volts (logic high), from a data system at the input $V_{IN}$. BTL level binary signals, i.e., digital signals having a voltage swing of approximately 1.0 Volts (logic low) to 2.1 Volts (logic high), are provided to a transmission line 31 at the output $V_{OUT}$. Both ends of the transmission line 31 are terminated to voltage level $V_T$ through the transmission line 31 characteristic impedance $R_T$. In the embodiment described herein, $V_T$ is equal to 2.1 Volts, the voltage of the BTL logical high level.

The driver 30 generally includes an output stage 32, a first input stage 34, and a second input stage 36. The driver 30 receives the data signals generated by the data system at $V_{IN}$ and feeds the compliments of these data signals to the first and second input stages 34 and 36. The first and second input stages 34 and 36 then cause the output stage 32 to generate either a BTL low or BTL high signal at the output node $V_{OUT}$. $V_{OUT}$ is then transmitted over the transmission medium.

One of the functions of the output stage 32 is to interface with a transmission medium and to feed data signals to the transmission medium. The output stage 32 has an output node $V_{OUT}$ for connection to the transmission medium.

The first input stage 34 is responsive to the data signals generated by the data system that are received at $V_{IN}$. The function of the first input stage 34 is to cause a low BTL signal, i.e., approximately 1.1 Volts, to be generated at the output node $V_{OUT}$. The first input stage 34 achieves this function by causing the first supply voltage $V_T$ to be divided within the output stage 32 so that a voltage substantially equal to the BTL logical low voltage level is present at the output node $V_{OUT}$. A voltage sensing amplifier 38 is used for sensing when $V_{OUT}$ is approximately equal to BTL logical low.

The second input stage 36 is also responsive to the data signals generated by the data system that are received at $V_{IN}$. The function of the second input stage 36 is to cause a high BTL signal, i.e., approximately 2.1 Volts, to be generated at the output node $V_{OUT}$. The second input stage 36 achieves this function by applying the first supply voltage $V_T$ to the output node $V_{OUT}$ so that a voltage substantially equal to the BTL logical high level, i.e., $V_T$, is present at the output node $V_{OUT}$.

A CMOS inverter 39 is preferably inserted between $V_{IN}$ and the first and second input stages 34 and 36. Thus, when it is said herein that the first and second input stages 34 and 36 are responsive to the data signals generated by the data system, it is intended that the input stages 34 and 36 are responsive to the data signals generated by the data system, or the compliments thereof.

In the specific configuration of the output stage 32, a large, open-drain n-channel transistor M1 has its drain connected to the output node $V_{OUT}$ and its source connected to ground. The gate of transistor M1 is connected to the output $V_{OS1}$ of the first input stage 34 and the output $V_{OS2}$ of the second input stage 36. Transistor M1 preferably has a channel width=1200 μm and a channel length=1 μm. It should be understood, however, that this is only a preferred channel size and that it may be varied to suit the needs of a particular application.

The first input stage 34 includes a p-channel switching transistor M2 having its source connected to a supply voltage $V_{DD}$, its gate connected to the output of the inverter 39, and its drain is connected to the source of a p-channel current source transistor M5. The drain of the current source transistor M5 is connected to the input $V_{VSAIN}$ of the voltage sensing amplifier 38, and the output $V_{OS1}$ of the voltage sensing amplifier 38 is connected directly to the gate of transistor Mi.

The voltage sensing amplifier 38 is a simple, well-known single stage CMOS differential amplifier. The amplifier 38 compares a reference input voltage $V_R$ that is slightly smaller than the BTL logical low voltage (~1 Volt) to the driver 30 output voltage $V_{OUT}$. Thus, the amplifier 38 is able to sense when the voltage at the output node $V_{OUT}$ is substantially equal to the BTL logical low level.

Figure 5:
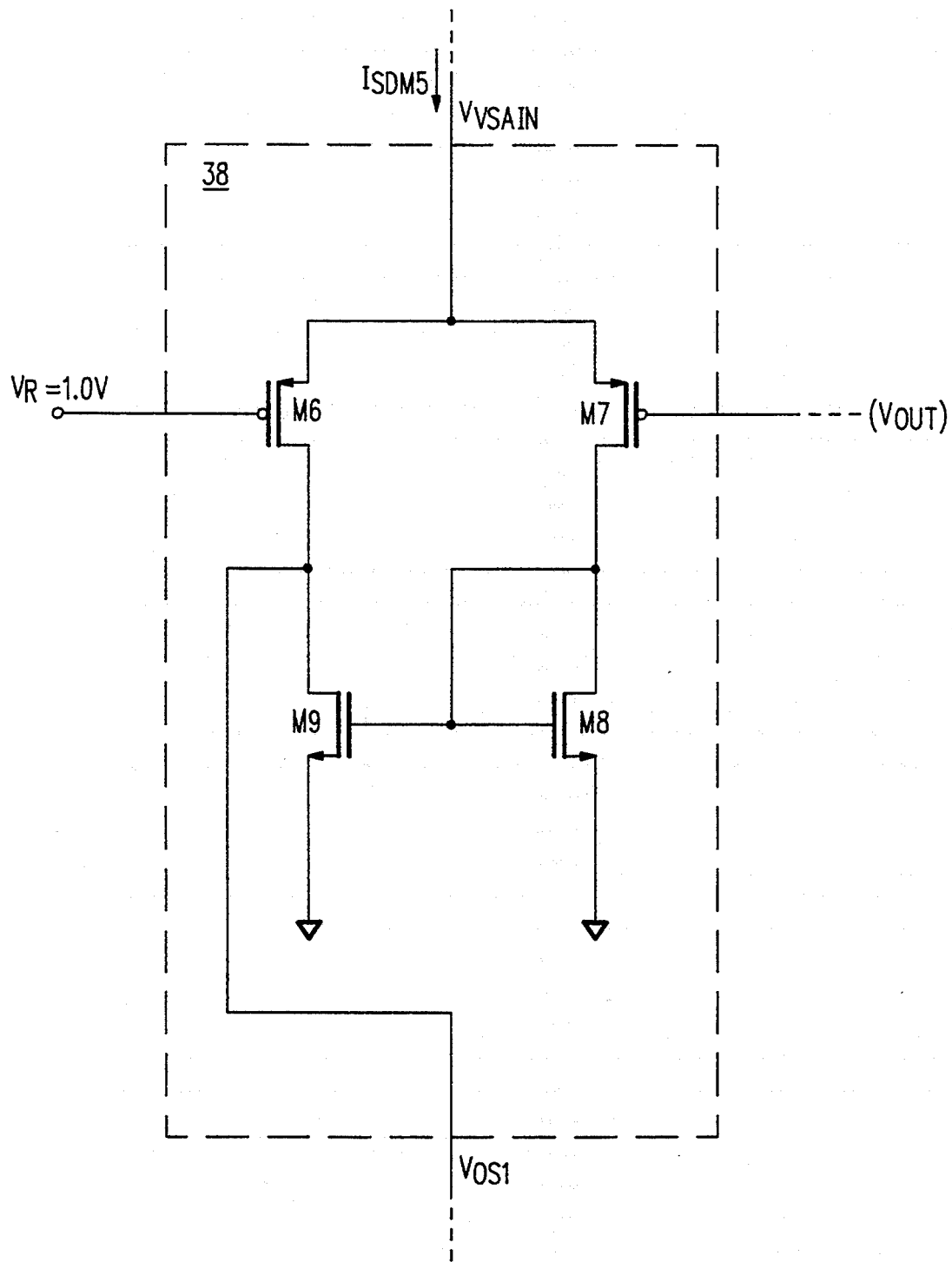
FIG. 5 is a schematic diagram illustrating a voltage sensing amplifier that may be used in the CMOS BTL transmission line driver shown in FIG. 4.

FIG. 5 shows the detailed structure of the voltage sensing amplifier 38. Two p-channel transistors M6 and M7 have their sources connected to $V_{VSAIN}$, i.e., the drain of transistor M5. The drains of transistors M6 and M7 are connected to the drains of two n-channel transistors M9 and M8, respectively, that have their sources grounded. The gates of transistors M9 and M8 are connected together and to the drain of transistor M7. The gate of transistor M6 is connected to the reference voltage $V_R$, and the gate of transistor M7 is connected to the output node $V_{OUT}$. Finally, the drain of transistor M6 is connected to $V_{OS1}$, i.e., the gate of transistor Mi.

Referring back to FIG. 4, the gate of the current source transistor M5 is connected to one output $V_{OP}$ of a programmable CMOS temperature compensation circuit 40. The temperature compensation circuit 40, along with the current source transistor M5, provide a means for adjusting the source-drain current $I_{SD}$ conducted by transistor M2 to compensate for temperature variations. The effects of temperature variation on MOSFET transistors, as well as the structure and operation of the temperature compensation circuit 40, will be described in detail below with reference to FIGS. 6 and 7. For the present discussion regarding the basic operation of the driver 30, however, it can be assumed that the output $V_{OP}$ maintains a source-gate potential $V_{SG}$ on transistor M5 such that it will conduct current whenever transistor M2 is switched on.

The second input stage 36 includes an n-channel switching transistor M3 having its source connected to ground, its gate connected to the output of the inverter 39, and its drain connected to the source of an n-channel current source transistor M4. The drain of the current source transistor M4 is connected directly to the gate of transistor M1, and the gate of the current source transistor M4 is connected to the other output $V_{ON}$ of the programmable CMOS temperature compensation circuit 40. Similar to output $V_{OP}$ and transistor M5, it can be assumed for the present discussion that the output $V_{ON}$ maintains a gate-source potential $V_{GS}$ on transistor M4 such that it will conduct current whenever transistor M3 is switched on.

In order to describe the operation of the driver 30, it will be assumed that the input $V_{IN}$ initially receives a low or logic "0" level CMOS signal, i.e., $V_{IN}=0$ Volts. The CMOS inverter 39 generates a "high" output which switches off the p-channel transistor M2. Because the p-channel transistor M2 is switched off, current source transistor M5 does not conduct current from source to drain. Because transistor M5 does not conduct current, the voltage sensing amplifier 38 is deenergized and its output $V_{OS1}$ has no effect on transistor M1. Thus, the first input stage 34 has no effect on the signal generated at the output node $V_{OUT}$.

The high output of the CMOS inverter 39 switches on the n-channel transistor M3 of the second input stage 36. With transistor M3 switched on, the current source transistor M4 is capable of conducting current from drain to source. Thus, transistors M4 and M3 conduct current from the gate of transistor M1 to ground, i.e., discharge the gate of transistor M1, in order to switch transistor M1 into a non-conductive state. This discharging current pulls the gate of the output transistor M1 low. Because its gate is pulled low, the output transistor M1 is switched off. The drain of transistor M1, i.e., the output node $V_{OUT}$, is pulled high to $V_T=2.1$ Volts because no current flows through resistors $R_T$. Thus, the second input stage's 36 function of generating a high BTL signal at the output node $V_{OUT}$ and on the transmission line 31 is achieved.

When the driver 30 input $V_{IN}$ switches to a high or logic "1" level CMOS signal, i.e., $V_{IN}=3.3$ Volts, the CMOS inverter 39 generates a "low" output which switches on the p-channel transistor M2. With transistor M2 switched on, the current source transistor M5 conducts a current $I_{SDM5}$ from source to drain. Thus, the input $V_{VSAIN}$ of the voltage sensing amplifier 38 is energized. It should be noted that the voltage sensing amplifier 38 can only be energized by transistors M2 and M5 when the driver's 30 input $V_{IN}$ is set at logic "1" (high).

Referring to FIG. 5 along with FIG. 4, because the reference voltage $V_R$ is lower than $V_{OUT}$ (before $V_{IN}$ went high, $V_{OUT}=V_T=2.1$ Volts), the p-channel transistor M6 conducts the current $I_{SDM5}$ conducted by transistor M5. The current $I_{SDM5}$ conducted by transistor M6 charges the gate of transistor M1, via output $V_{OS1}$, linearly upward at a rate of $I_{SDM5}/C_{gM1}$, where $C_{gM1}$ is the total node capacitance at the gate of transistor $M_1$.

When the gate-source voltage $V_{GSM1}$ of transistor M1 rises to the n-channel threshold voltage $V_{TH}$ ($V_{TH} \sim 0.8$ Volts), transistor M1 begins to conduct current from drain to source which pulls the output voltage $V_{OUT}$ gradually toward a lower level. $V_{OUT}$ is pulled lower because current begins to flow through resistors $R_T$ creating a voltage drop thereacross. The voltage drop across resistors $R_T$ results in the voltage $V_T$ being divided within the output stage 32 between the resistors $R_T$ and the output node $V_{OUT}$.

When $V_{OUT}$ decreases down to a point where it is substantially equal to $V_R$ (i.e., $\sim 1$ Volt), transistor M6 stops conducting current to the gate of transistor M1. The voltage at the output node $V_{OUT}$ remains at the BTL low signal level, i.e., $\sim 1$ Volt. If voltage $V_{OUT}$ were to fall below 1 Volt for some reason, then transistor M7 would begin to conduct current because it would have a lower gate voltage that transistor M6. Transistor M8 would begin to conduct current which would cause transistor M9 to conduct a substantially equal current because transistors M8 and M9 have equal channel sizes and form a current mirror. Transistor M9 tends to discharge the gate of transistor M1 which raises voltage $V_{OUT}$. When voltage $V_{OUT}$ rises to 1 Volt, transistor M7 stops conducting current. Thus, the first input stage's 34 function of generating a low BTL signal at the output node $V_{OUT}$ and the transmission line 31 is achieved.

In the embodiment shown in FIG. 4, transistor M2 has a channel width=400 $\mu$m and a channel length =1 $\mu$m, transistor M3 has a channel width=100 $\mu$m and a channel length=1 $\mu$m, transistor M4 has a channel width=80 $\mu$m and a channel length=1 $\mu$m, and transistor M5 has a channel width=180 $\mu$m and a channel length=1 $\mu$m. In the embodiment shown in FIG. 5, transistors M6 and M7 have channel widths=200 $\mu$m and channel lengths=1 $\mu$m, and transistors M8 and M9 have channel widths=5 $\mu$m and channel lengths =2 $\mu$m. It should be understood that these are only preferred channel sizes and that they may be varied to suit the needs of a particular application.

Figure 1:
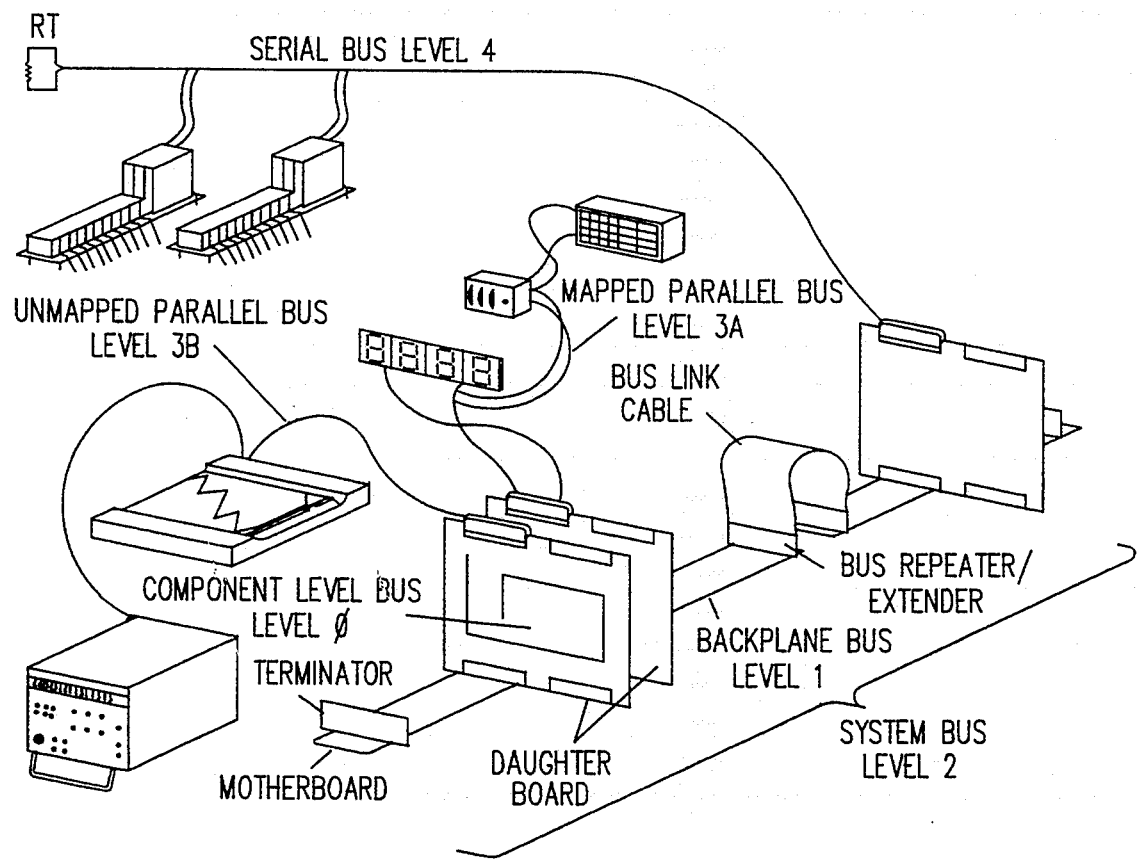
FIG. 1 is a pictorial illustration of the hierarchy of bus levels in a Futurebus+ system.
Figure 2:
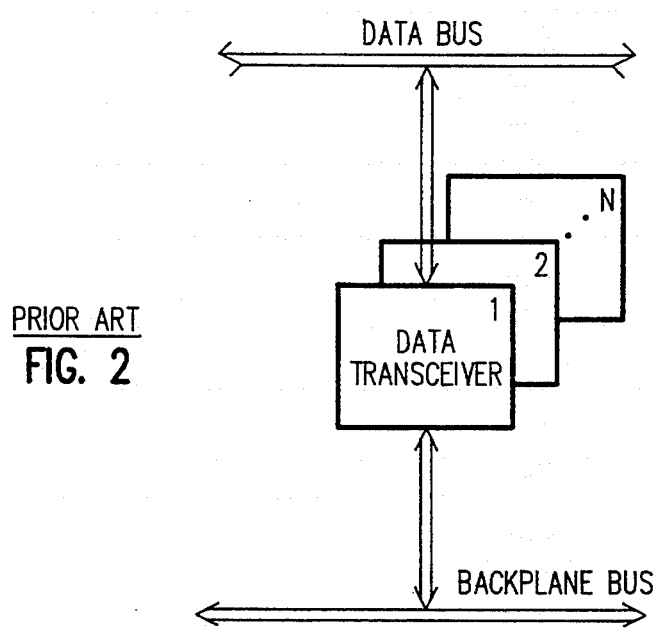
FIG. 2 is a block diagram illustrating the placement of a data transceiver between the backplane bus of a Futurebus+ system and the data bus of a processor in the Futurebus+ system.
Figure 3:
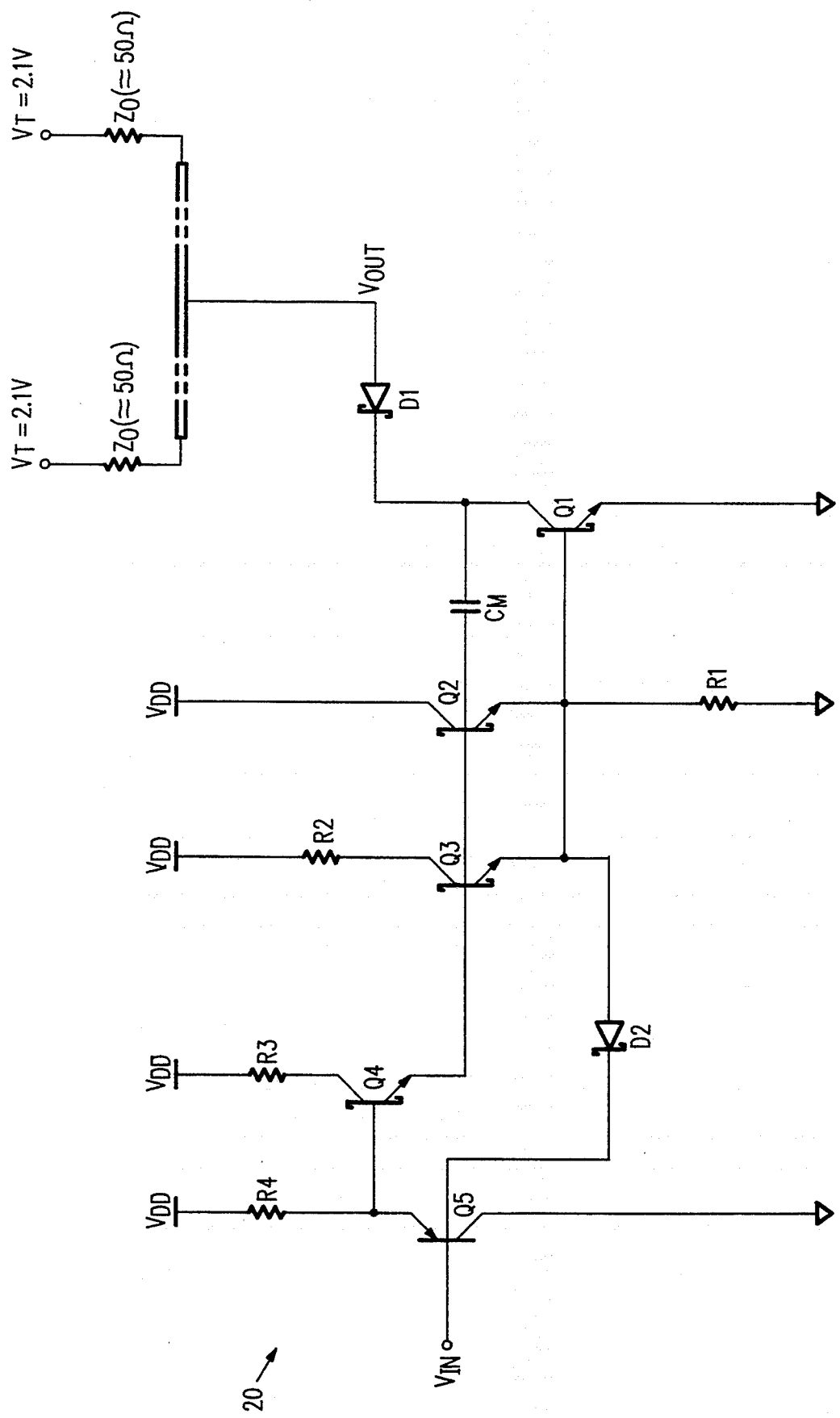
FIG. 3 is a schematic diagram illustrating a conventional bipolar transistor BTL transmission line driver.

As mentioned above, the programmable CMOS temperature compensation circuit 40, along with the current source transistors M5 and M4, provide a means for adjusting the source-drain current $I_{SD}$ through transistor M2 and the drain-source current $I_{DS}$ through transistor M3 to compensate for temperature variations. Use of the temperature compensation circuit 40 with the driver 30 prevents the problematic variations in risetime $t_r$ and fall time $t_f$ due to variations in temperature and voltage supply $V_{DD}$ that plague the bipolar driver 20 shown in FIG. 3.

Temperature variations affect the performance of FETs. Temperature variations may be in the form of ambient temperature variations, i.e., variations in the temperature of the air surrounding integrated circuits, and/or junction temperature variations, i.e., variations in the temperature of the silicon in an integrated circuit. Ambient temperature variations can cause junction temperature variations, and vice versa.

FET performance is affected because temperature variations tend to cause the transconductance $g_m$ of the transistors to vary. The amount of current that is conducted by a transistor's current conducting channel, i.e., the current conducted between the drain and source ($I_{DS}$ for n-channel and $I_{SD}$ for p-channel), is determined in part by $g_m$. In the case of a MOSFET, when temperature increases, transconductance $g_m$ decreases which causes currents $I_{DS}$ and $I_{SD}$ to decrease. On the other hand, when temperature decreases, transconductance $g_m$ increases which causes $I_{DS}$ and $I_{SD}$ to increase. Thus, it may be said that the current conducted by the channel of a MOSFET has a negative temperature coefficient. Furthermore, $I_{DS}$, $I_{SD}$, and $g_m$ vary linearly with temperature variations.

Logic gates, such as the driver 30, are typically constructed from several transistors. The speed of a logic gate is determined in part by the $I_{DS}$ of the individual transistors, which results in gate speed being proportional to $g_m$. If the $g_m$ of each transistor in a logic gate varies with temperature, then the $I_{DS}$ of each transistor also varies which causes the speed of the logic gate to vary with temperature. For example, when temperature increases, gate speed decreases, and when temperature decreases, gate speed increases.

Variations in gate speed due to temperature variations is an undesirable characteristic because such variations can adversely affect the synchronized timing operations of a digital system. Digital systems can be designed to operate more efficiently if the designer can be assured that gate speed will remain constant. Gate speed can be kept relatively constant if temperature is kept constant. However, because digital systems must operate in a variety of environments, ambient and junction temperature cannot always be controlled. A relatively constant logic gate speed can be maintained during temperature variations if the current conducted by the conducting channels of a logic gate's MOSFET transistors is maintained at relatively constant levels despite the temperature variations.

Figure 6:
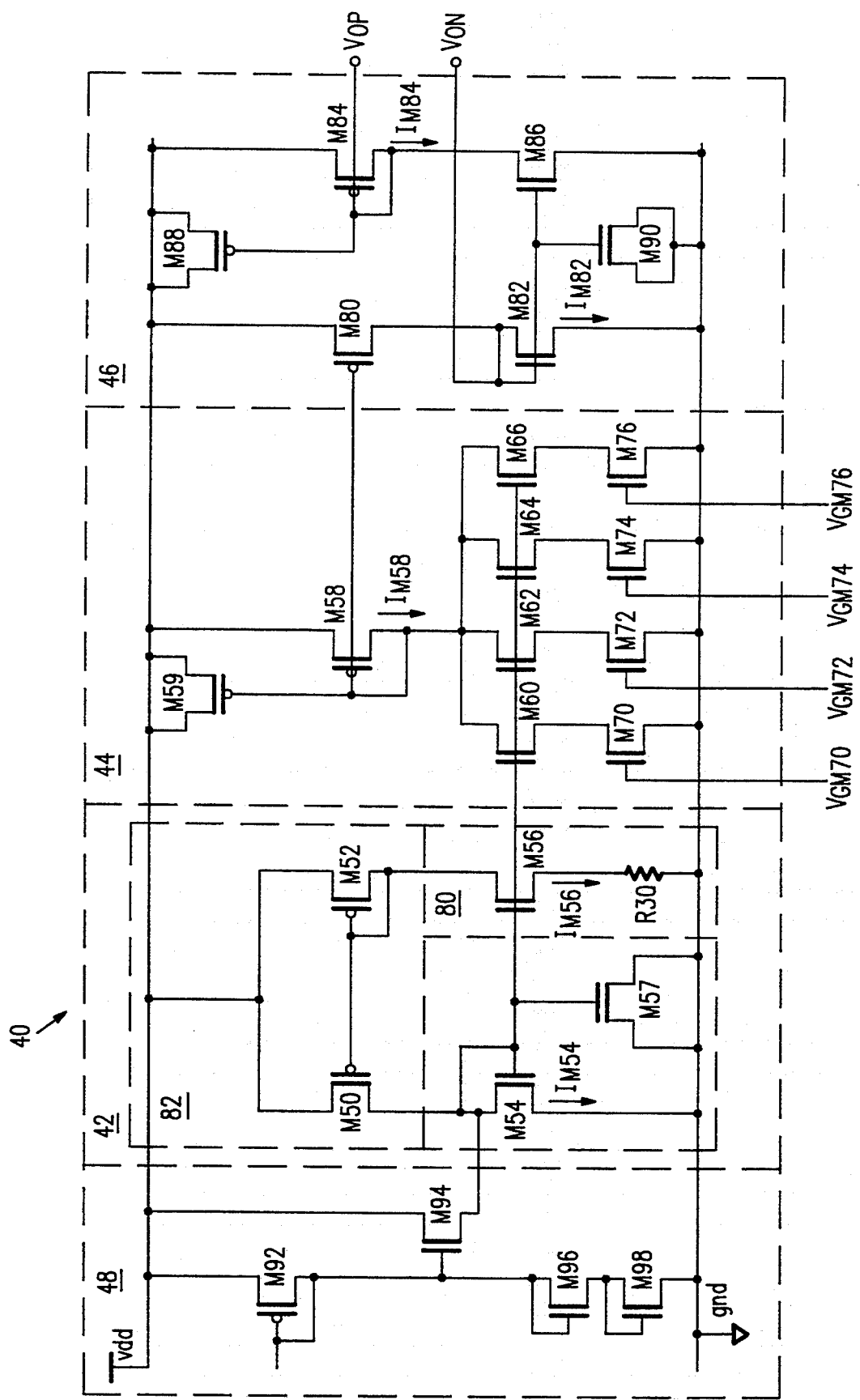
FIG. 6 is a schematic diagram illustrating a programmable CMOS temperature compensation circuit that may be used in the CMOS BTL transmission line driver shown in FIG. 4.

FIG. 6 shows the detailed structure of the programmable CMOS temperature compensation circuit 40. The circuit 40 is capable of adjusting the currents $I_{DS}$ and $I_{SD}$ generated by transistors M4 and M5, respectively, to compensate for temperature variations.

In general, the circuit 40 adjusts the $I_{SD}$ generated by transistor M5 to compensate for variations in temperature by adjusting transistor M5's gate voltage in response to the temperature variations. Because transistor M5 is a p-channel MOSFET, when temperature increases, the circuit 40 adjusts the gate voltage of the transistor, via output $V_{OP}$, so that the source-gate voltage $V_{SGM5}$ increases. By increasing voltage $V_{SGM5}$, more current $I_{SD}$ will be conducted by the transistor M5's conducting channel which will compensate for the decrease in current $I_{SD}$ due to the increase in temperature. On the hand, when temperature decreases, the circuit 40 adjusts the gate voltage of transistor M5 so that the source-gate voltage $V_{SGM5}$ decreases. By decreasing voltage $V_{SGM5}$, less current $I_{SD}$ will be conducted by the transistor's conducting channel which will compensate for the increase in current $I_{SD}$ due to the decrease in temperature.

The output $V_{ON}$ is for adjusting the gate voltage of the n-channel MOSFET M4 to compensate for temperature variations. When temperature increases, $V_{ON}$ increases voltage $V_{GSM4}$ which causes more current $I_{DS}$ to be conducted by transistor M4's conducting channel. The increase in current $I_{DS}$ compensates for the decrease in current $I_{DS}$ due to the increase in temperature. On the other hand, when temperature decreases, $V_{ON}$ decreases voltage $V_{GSM4}$ which causes less current $I_{DS}$ to be conducted by the transistor's conducting channel. The decrease in current $I_{DS}$ compensates for the increase in current $I_{DS}$ due to the decrease in temperature.

Voltages $V_{SGM5}$ and $V_{GSM4}$ may be adjusted (via $V_{OP}$ and $V_{ON}$, respectively) so that the currents $I_{SDM5}$ and $I_{DSM4}$ are maintained at relatively constant levels during temperature variations. Preferably, however, voltages $V_{SGM5}$ and $V_{GSM4}$ are adjusted so that the currents $I_{SDM5}$ and $I_{DSM4}$ actually increase during temperature increases and decrease during temperature decreases. In the later scenario, voltages $V_{SGM5}$ and $V_{DSM4}$ are simply increased or decreased slightly more than they would be in the first scenario. Increasing or decreasing the currents $I_{SDM5}$ and $I_{DSM4}$ according to the later scenario tends to compensate other transistors in the driver 30 that have no direct temperature compensation system, such as the transistors in the voltage sensing amplifier 38 and transistor MI. For example, increasing the currents $I_{SDM5}$ and $I_{DSM4}$ in response to a temperature increase will tend to increase the current conducted by the other uncompensated MOSFETs in the circuit.

The temperature compensation circuit 40 includes a positive temperature coefficient current generation stage 42, a programmable current transfer and modification stage 44, an output stage 46, and a start-up stage 48.

The current generation stage 42 is an important component of the circuit 40 because it generates a drain-source current $I_{M54}$ in a MOSFET that has a positive temperature coefficient. In other words, when temperature increases, current $I_{M54}$ increases, and when temperature decreases, current $I_{M54}$ decreases. As discussed above, the current conducted by the channel of a MOSFET normally has a negative temperature coefficient. Because current $I_{M54}$ has a positive temperature coefficient, the current transfer and modification stage 44 and the output stage 46 are able to use current $I_{M54}$ to generate the outputs $V_{OP}$ and $V_{ON}$ which compensates for temperature variations.

The current generation stage 42 includes an n-channel transistor M54, a monitoring circuit 80, and a current generator 82. In general, the positive temperature coefficient current $I_{M54}$ is generated as follows: The current generator 82 generates and maintains two substantially equal currents $I_{M54}$ and $I_{M56}$ that are provided to the drain of transistor M54 and the monitoring circuit 80, respectively. When the strength of one of these currents changes, the current generator 82 changes the strength of the other current so that the two currents $I_{M54}$ and $I_{M56}$ remain substantially equal. The monitoring circuit 80 monitors the potential difference between the gate and source of transistor M54 and increases the strength of current $I_{M56}$ in response to an increase in temperature, and decreases the strength of current $I_{M56}$ in response to a decrease in temperature. Whether current $I_{M56}$ is increased or decreased by the monitoring circuit 80, the current generator 82 adjusts current $I_{M54}$ so that the two currents remain substantially equal. Thus, current $I_{M54}$ increases when temperature increases and decreases when temperature decreases.

The monitoring circuit 80 includes an n-channel transistor M56 which has its gate coupled to the gate of transistor M54. A resistor R30 is coupled between a first node that is common with the source of transistor M54 and a second node that is common with the source of transistor M56. In the embodiment shown in FIG. 6, the first node is ground.

As indicated in FIG. 6, transistor M56 has a larger current conducting channel than the current conducting channel of transistor M54. Preferably, the channel of transistor M56 has a width of 160 $\mu$m (micro-meters) and a length of 2 $\mu$m, and the channel of transistor M54 has a width of 40 $\mu$m and a length of 2 $\mu$m. As will be discussed below, the smaller channel size of transistor M54 results in $V_{GSM54}$ being larger than $V_{GSM56}$ when the channels of transistors M54 and M56 conduct equal currents.

The current generator 82 includes two p-channel transistors M50 and M52 that have their gates coupled together. Transistor M50 has its drain coupled to the drain of transistor M54. Transistor M52 has its drain coupled to its gate and to the drain of transistor M56. The sources of transistors M50 and M52 are coupled to a common node so that the transistors function as a current mirror. In the embodiment shown in FIG. 6, the common node is a supply voltage $V_{DD}$.

As indicated in FIG. 6, transistors M50 and M52 have current conducting channels that are substantially the same size. Preferably, the channels of transistors M50 and M52 have widths of 80 $\mu$m and lengths of 2 $\mu$m. Furthermore, current $I_{M54}$ flows from the drain of transistor M50, and current $I_{M56}$ flows from the drain of transistor M52.

During operation, the equal currents $I_{M54}$ and $I_{M56}$ generated by the current generator 82 force the currents through transistors M54 and M56 to be equal. Because transistor M54 has a higher current density than transistor M56 (due to transistor M54 having a smaller conducting channel), the $V_{GS}$ of transistor M54, i.e., $V_{GSM54}$, is larger than the $V_{GS}$ of transistor M56, i.e., $V_{GSM56}$.

The drain-source current $I_{DS}$ of a MOSFET is equal to:

$$I_{DS} = \mu C_o \frac{W}{L}(V_{GS} - V_{TH})^2$$

where, $W$ = conducting channel width;
$L$ = conducting channel length;
$V_{TH}$ = threshold voltage;

$$\mu(T) \alpha \frac{1}{T^{1.5}}; \text{ and}$$

$T$ = temperature

From this equation it follows that, if current $I_{DS}$ of a MOSFET is held constant, then voltage $V_{GS}$ will increase when temperature increases, and vice versa. Thus, because the current generator 82 maintains both currents $I_{M54}$ and $I_{M56}$ at a relatively constant level, voltages $V_{GSM54}$ and $V_{GSM56}$ will both increase when temperature increases and both decrease when temperature decreases. Furthermore, because transistor M54 has a higher current density than transistor M56, voltage $V_{GSM54}$ will increase or decrease more than voltage $V_{GSM56}$.

The current through resistor R30 is equal to:

$$I_{R30} = (V_{GSM54} - V_{GSM56})/R30$$

Furthermore, $$I_{R30} = I_{M56}$$

As temperature increases, voltages $V_{GSM54}$ and $V_{GSM56}$ both increase with voltage $V_{GSM54}$ increasing more than voltage $V_{GSM56}$. Thus, the difference between voltages $V_{GSM54}$ and $V_{GSM56}$ increases as temperature increases which causes $I_{R30}$, and thus, current $I_{M56}$, to increase. Because transistors M50 and M52 are connected to operate as a current mirror, current $I_{M54}$ remains substantially equal to current $I_{M56}$. Therefore, as current $I_{M56}$ increases with increasing temperature, current $I_{M54}$ also increases. Conversely, as current $I_{M56}$ decreases with decreasing temperature, current $I_{M54}$ also decreases.

Briefly summarizing, the drain-source current $I_{DS}$ of a MOSFET normally has a negative temperature coefficient, i.e., as temperature increases, current $I_{DS}$ decreases. However, the drain-source current $I_{M54}$ of transistor M54 has a positive temperature coefficient, i.e., as temperature increases, current $I_{M54}$ increases. This phenomenon that occurs in the current generation stage 42 permits the other components of the circuit 40 to provide an output $V_{OP}$ to adjust the gate voltage of MOSFETs in order to compensate for variations in temperature.

It should also be noted that the positive temperature coefficient current generation stage 42 is normally not affected by variations in $V_{DD}$. Specifically, transistors M50 and M52 operate in the saturation range while conducting currents $I_{M54}$ and $I_{M56}$. If the supply voltage $V_{DD}$ changes, then the source-drain voltages $V_{SD}$ of each transistor M50 and M52 also change because the drains of transistors M54 and M56 are very high impedance. However, the currents $I_{M54}$ and $I_{M56}$ do not change because the transistors M50 and M52 are operating in saturation. Therefore, current $I_{M54}$, which has a positive temperature coefficient, is not affected by variations in $V_{DD}$.

It is envisioned that the n-channel transistors M54 and M56 could be replaced with p-channel transistors, and that the p-channel current generating transistors M50 and M52 could be replaced with n-channel transistors. In this scenario, p-channel transistors M54 and M56 would have different size conducting channels and have their sources coupled to $V_{DD}$, and n-channel transistors M50 and M52 would have equal size conducting channels and have their sources coupled to ground.

An n-channel transistor M57, which is optional, is used to filter out noise that may be present on the ground line. Transistor M57 is capacitor connected between ground and the gates of transistors M54 and M56, i.e., transistor M57 has its source and drain coupled to ground and its gate coupled to the gates of transistors M54 and M56.

Noise that is present on the ground line will reach the sources of transistors M54 and M56 via their connections to ground. Capacitor connected transistor M57 will let noise pass to the gates of transistors M54 and M56. Because the noise is present at both the gate and source of transistors M54 and M56, the $V_{GS}$ of each transistor should remain relatively constant.

The programmable current transfer and modification stage generates a current $I_{M58}$ that may be selectively programmed to be any one of several values that are linear proportional to current $I_{M54}$ conducted by the channel of transistor M54. This programmability allows current $I_{M54}$ to be "modified" to have a desired value, and, whatever value is selected, current $I_{M58}$ will have a positive temperature coefficient. Thus, the temperature compensation provided by outputs $V_{OP}$ and $V_{ON}$ is capable of inducing currents in transistors M4 and M5 that are a fraction or a multiple of current $I_{M54}$.

The current transfer and modification stage 44 includes four n-channel transistors M60, M62, M64, and M66 that each have a different size current conducting channel. Each of the transistors M60, M62, M64, and M66 has its gate coupled to the gate of transistor M54 and its drain coupled to the drain of transistor M58. Furthermore, each of the transistors M60, M62, M64, and M66 forms a current mirror with transistor M54; in other words, the $V_{GS}$ of transistor M54 will be substantially equal to the $V_{GS}$ of each one of the transistors M60, M62, M64, and M66.

The current transfer and modification stage 44 also includes four n-channel transistors M70, M72, M74, and M76 which respectively couple the source of each of the transistors M60, M62, M64, and M66 to ground. The purpose of transistors M70, M72, M74, and M76 is to permit current $I_{M58}$ to be selectively programmed to be conducted by the channel of only one of the transistors M60, M62, M64, and M66 at a time. The gate inputs $V_{GM70}$, $V_{GM72}$, $V_{GM74}$, and $V_{GM76}$, which switch transistors M70, M72, M74, and M76 "on" and "off", respectively, will normally be set such that only one of transistors M60, M62, M64, and M66 conducts current. Transistor M60 conducts current when transistor M70 is "on", transistor M62 conducts current when transistor M92 is "on" and so on In the embodiment shown in FIG. 6, transistor M60 has a channel width=80 μm and a channel length =2 μm, transistor M62 has a channel width=40 μm and a channel length=2 μm, transistor M64 has a channel width=27 μm and a channel length=2 μm, and transistor M66 has a channel width=20 μm and a channel length=2 μm. Furthermore, transistor M70 has a channel width=160 μm and a channel length=2 μm, transistor M72 has a channel width=80 μm and a channel length=2 μm, transistor M74 has a channel width=56 μm and a channel length=2 μm, and transistor M76 has a channel width=40 μm and a channel length=2 μm.

Current $I_{M58}$ will vary according to the "on/off" status of transistors M70, M72, M74, and M96 because these transistors determine which one of the transistors M60, M62, M64, and M66, which all have different channel sizes, will conduct current $I_{M58}$. Current $I_{M58}$ can be made equal to a fraction or a multiple of $I_{M54}$ by adjusting the channel size of the transistor which conducts $I_{M58}$. For example, when $I_{M58}$ is conducted through transistor M60, $I_{M58}$ will be twice as large as $I_{M54}$ because transistor M60's channel is twice as large as transistor M54's channel; when $I_{M58}$ is conducted through transistor M62, $I_{M58}$ will be equal to $I_{M54}$ because transistor M62's channel is the same size as transistor M54's channel. Thus:

$$I_{M58} = 2 I_{M54} \quad \text{when } M70 \text{ is ON}$$
$$= 1 I_{M54} \quad \text{when } M72 \text{ is ON}$$
$$= 0.67 I_{M54} \quad \text{when } M74 \text{ is ON}$$
$$= 0.5 I_{M54} \quad \text{when } M76 \text{ is ON}$$

By selectively programing the inputs $V_{GM70}$, $V_{GM72}$, $V_{GM74}$, and $V_{GM76}$, current $I_{M54}$ is "transferred" to current $I_{M58}$ and "modified" to be a fraction or multiple of $I_{M54}$. The inputs $V_{GM70}$, $V_{GM72}$, $V_{GM74}$, and $V_{GM76}$ are controlled by logic circuitry which will be discussed below with reference to FIGS. 7A and 7B.

It should be noted that, because transistors M70, M72, M74, and M76 each have a channel size that is twice as large as their respective transistors M60, M62, M64, and M66, the presence of transistors M70, M72, M74, and M76 does not significantly affect the current mirror relationship between transistor M54 and transistors M60, M62, M64, and M66.

Using the mirror effect and adjusting the channel size of transistor M62 may seem like a complex way to modify current $I_{M54}$ because current $I_{M54}$ can also be modified by adjusting the value of resistor R30. However, the temperature coefficient of current $I_{M56}$ varies with its current level which is a function of the value of R30 and the channel width and length of transistors M54 and M56. Therefore, it is not desirable to adjust current $I_{M54}$ by varying R30 because such variation will also change current $I_{M54}$'s temperature coefficient.

The transfer and modification stage 44 also includes an optional capacitor connected p-channel transistor M59 that is coupled between $V_{DD}$ and the gate of transistor M58 in order to filter out noise that may be present in the $V_{DD}$ line. Specifically, transistor M59's source and drain are coupled to $V_{DD}$ and its gate is coupled to the gate of transistor M58.

The output stage 46 is coupled to the gate of transistor M58. The purpose of the output stage 46 is to generate two currents, $I_{M82}$ and $I_{M84}$, that are linearly proportional to current $I_{M58}$. Current $I_{M82}$ is used to generate output voltage $V_{ON}$ for application to the gates of n-channel MOSFETs to compensate for variations in temperature, and current $I_{M84}$ is used to generate output voltage $V_{OP}$ for application to the gates of p-channel MOSFETs to compensate for variations in temperature.

A p-channel transistor M80 has its source coupled to $V_{DD}$, its gate coupled to the gate of transistor M58, and its drain coupled to the drain of an n-channel transistor M82. Transistor M82 has its gate is coupled to its drain and its source coupled to ground. The channels of transistors M80 and M82 conduct current $I_{M82}$, and the gate of transistor M82 provides output $V_{ON}$.

Transistor M80 forms a current mirror with transistor M58; thus, the $V_{GS}$ of the two transistors will be substantially equal. Current $I_{M82}$ will be linear proportional to current $I_{M58}$ and have a positive temperature coefficient. The value of $I_{M82}$ will depend on the channel size of transistor M80. In the embodiment shown in FIG. 6, transistor M80 has a channel width=50 μm and a channel length=1 μm, and transistor M82 has a channel width=10 μm and a channel length=1 μm. Because transistor M80 has a larger channel than transistor M58, current $I_{M82}$ will be larger than current $I_{M58}$. It should be understood, however, that by adjusting the channel size of transistor M80, the strength of current $I_{M82}$ can be adjusted, and by adjusting the channel size of transistor M82, the output voltage $V_{ON}$, which is equal to $V_{GSM82}$, can be adjusted.

By connecting output $V_{ON}$ to the gate of n-channel transistor M4, a current mirror is formed between transistor M82 and transistor M4. Thus, the current conducted by the channel of transistor M4 will be linear proportional to current $I_{M82}$ and have a positive temperature coefficient.

A p-channel transistor M84 has its source coupled to $V_{DD}$, its gate coupled to its drain, and its drain coupled to the drain of an n-channel transistor M86. Transistor M86 has its source coupled to ground and its gate coupled to the gate of transistor M82. The channels of transistors M84 and M86 conduct current $I_{M84}$, and the gate of transistor M84 provides output $V_{OP}$.

Transistor M86 forms a current mirror with transistor M82; thus, the $V_{GS}$ of the two transistors will be substantially equal. Current $I_{M84}$ will be linear proportional to currents $I_{M82}$ and $I_{M58}$, and have a positive temperature coefficient. The value of $I_{M84}$ will depend on the channel size of transistor M86. In the embodiment shown in FIG. 6, transistor M86 has a channel width=26 μm and a channel length =1 μm, and transistor M84 has a channel width=80 μm and a channel length=1 μm. Because transistor M86 has a larger channel than transistor M82, current $I_{M84}$ will be larger than current $I_{M82}$. It should be understood, however, that by adjusting the channel size of transistor M86, the strength of current $I_{M84}$ can be adjusted, and by adjusting the channel size of transistor M84, the output voltage $V_{OP}$, which is equal to $V_{SGM84}$, can be adjusted.

By connecting output $V_{OP}$ to the gate of p-channel transistor M5, a current mirror is formed between transistor M84 and transistor M5. Thus, the current conducted by the channel of transistor M5 will be linear proportional to current $I_{M84}$ and have a positive temperature coefficient.

Optional capacitor connected p-channel transistor M88 and n-channel transistor M90 filter noise that may be present on the $V_{DD}$ and ground lines, respectively. Transistor M88 has its source and drain coupled to $V_{DD}$ and its gate coupled to the gate of transistor M84. Transistor M90 has its source and drain coupled to ground and its gate coupled to the gates of transistors M82 and M86.

The purpose of the start-up stage 48 is to feed current to transistor M54 when the voltage supply $V_{DD}$ initially starts from ground level so that transistor M54's conducting channel can begin to conduct current.

An n-channel transistor M94 has its drain coupled to $V_{DD}$ and its source coupled to the drain of transistor M54. A diode connected p-channel transistor M92 is coupled between $V_{DD}$ and the gate of transistor M94, and two diode connected n-channel transistors M96 and M98 couple the gate of transistor M94 to ground. In the embodiment shown in FIG. 6, transistor M94 has a channel width=5 μm and a channel length=2 μm, transistor M92 has a channel width=3 μm and a channel length=100 μm, and transistors M96 and M98 have channel widths=60 μm and channel lengths=2 μm. The channel sizes of transistors M92, M94, M96, and M98 may be varied to suit the needs of a particular application.

When voltage supply $V_{DD}$ initially starts from ground level, none of the transistors carry current. When $V_{DD}$ rises above three times the threshold voltage, i.e., 3 $V_{TH}$, of transistor M94, transistor M94 feeds current into the drain of transistor M54. As the channel of transistor M54 begins to conduct current, a voltage drop is induced across the gate and source of transistor M56. Transistor M56 begins to conduct current which causes transistor M52 to begin to conduct current, Due to the current mirror action, transistor M50 also begins to conduct current which feeds back to transistor M54. This positive feedback continues until the current conducted by transistor M56 reaches its final value. Because the gate of transistor M94 is clamped by diode connected transistors M96 and M98, the rise of the drain potential of transistor M54 eventually shuts off transistor M94.

Figures 7A, 7B:
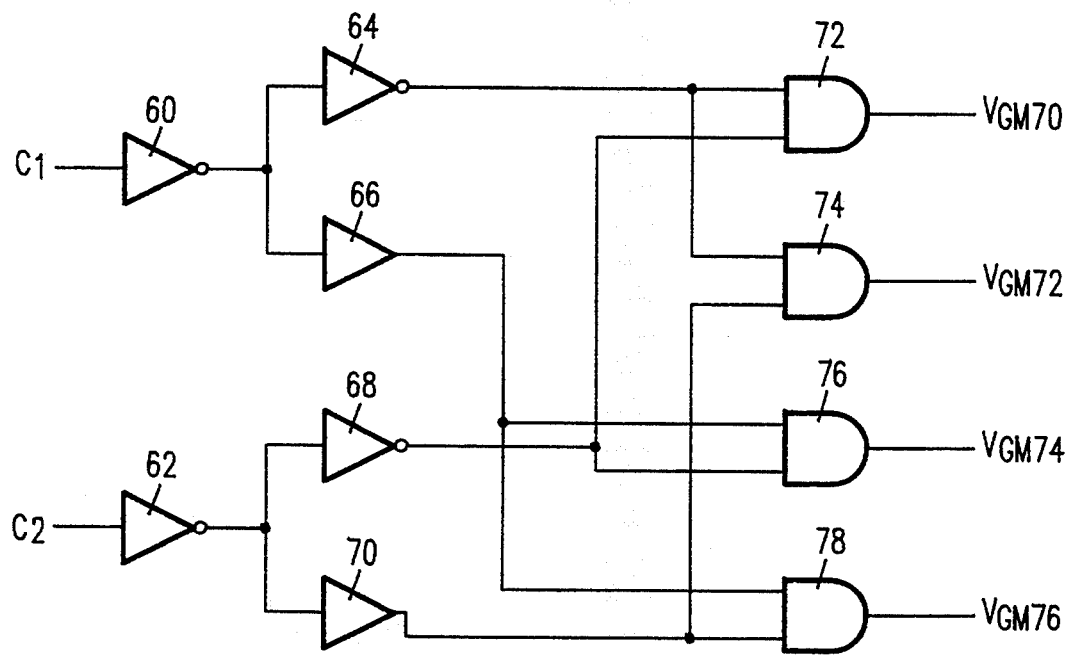
FIG. 7A is a schematic diagram illustrating control logic circuitry that may be used for programming the temperature compensation circuit shown in FIG. 6.
FIG. 7B is a truth table for the control logic circuitry shown in FIG. 7A.

FIG. 7A shows the control logic circuitry for programming transistors M70, M72, M74, and M76 so that only one of transistors M60, M62, M64, and M66 conducts current $I_{M58}$ at a time. The control logic includes two inverters 60 and 62 that receive at their inputs control signals C1 and C2, respectively. The output of inverter 60 is coupled to the input of an inverter 64 and the input of a buffer 66, and the output of inverter 62 is coupled to the input of an inverter 68 and the input of a buffer 70.

Four AND gates 72, 74, 76, and 78 receive the outputs of inverters 64 and 68 and buffers 66 and 70. Specifically, AND gate 72 receives the outputs of inverters 64 and 68, AND gate 74 receives the outputs of inverter 64 and buffer 70, AND gate 76 receives the outputs of buffer 66 and inverter 68, and AND gate 78 receives the outputs of buffers 66 and 70. AND gates 72, 74, 76, and 78 have their outputs $V_{GM70}$, $V_{GM72}$, $V_{GM74}$, and $V_{GM76}$ coupled to the gates of transistors M70, M72, M74, and M76, respectively.

FIG. 7B shows a truth table for the logic circuit of FIG. 7A. For each combination of control signals C1 and C2, only one of the outputs $V_{GM70}$, $V_{GM72}$, $V_{GM74}$, and $V_{GM76}$ will be logic "1" at a time.

It should be understood that the programmability feature of the current transfer and modification stage 44 that is implemented by the use of the several transistors M60, M62, M64, M66, M70, M72, M74, and M76, as well as the control logic circuitry shown in FIG. 7A, is optional. Current $I_{M54}$ may be modified, i.e., amplified, by simply substituting for transistors M60, M62, M64, and M66 various transistors that have various different channel sizes.

Figure 8:
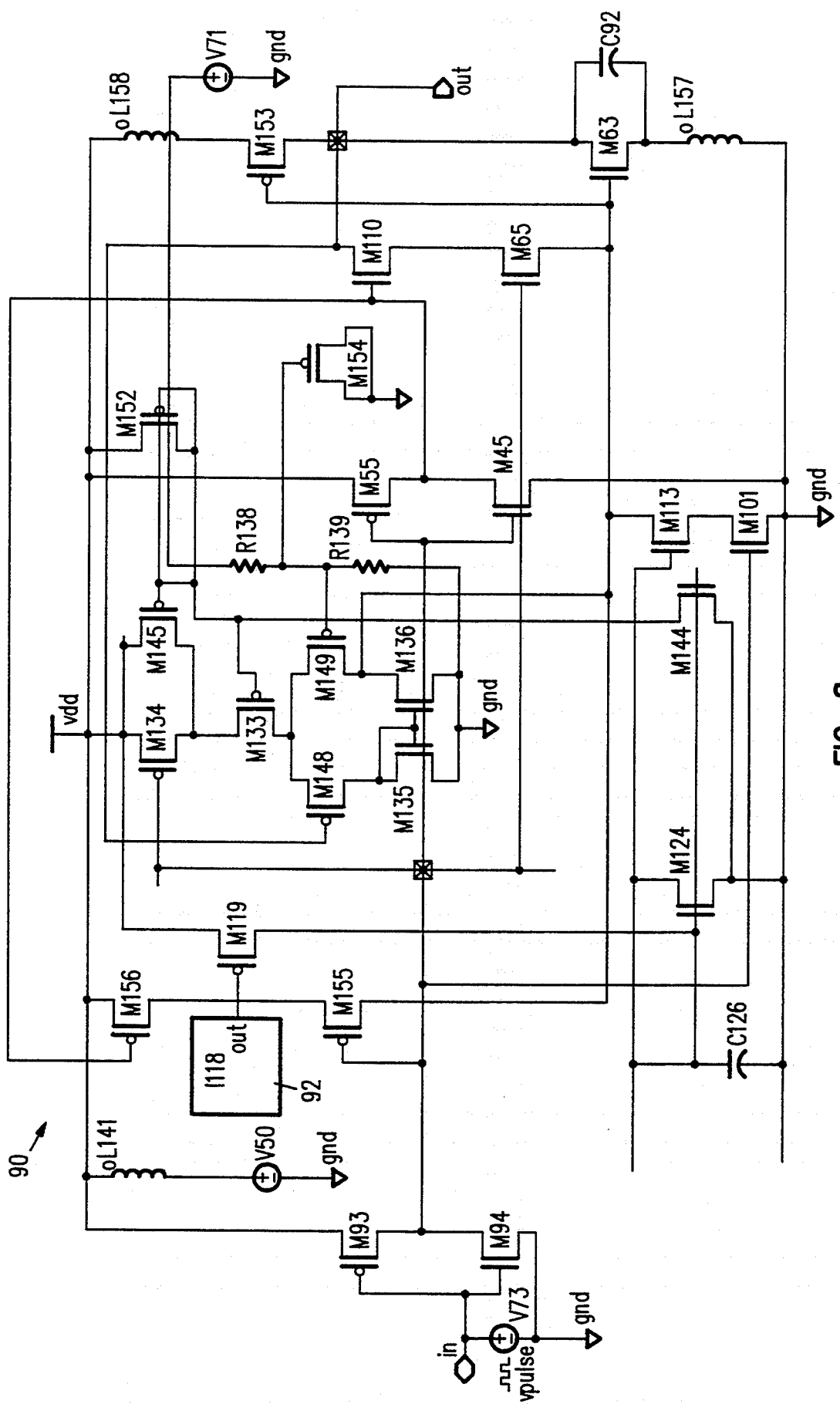
FIG. 8 is a more detailed schematic diagram illustrating the CMOS BTL transmission line driver shown in FIG. 4.
Figure 9:
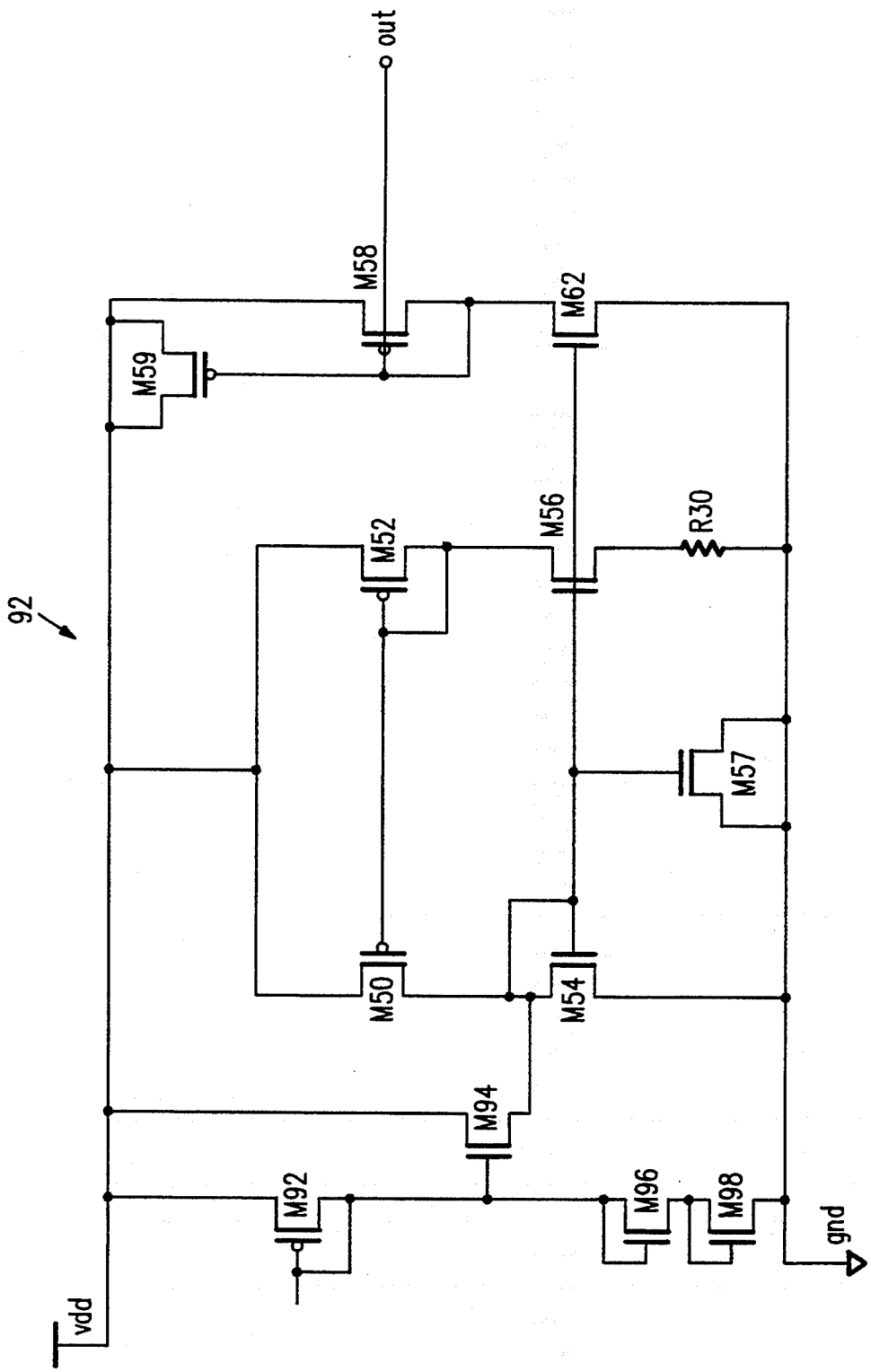
FIG. 9 is a schematic diagram illustrating a CMOS temperature compensation circuit that may be used in the CMOS BTL transmission line driver shown in FIG. 8.

FIG. 8 shows a detailed schematic of another embodiment of a CMOS BTL transmission line driver 90 in accordance with the present invention. One difference between the driver 90 and the driver 30 is that the temperature compensation circuit 92 is not programmable. FIG. 9 shows the temperature compensation circuit 92 for the driver 90. The circuit 92 provides only p-channel transistor temperature compensation. The circuitry that provides the n-channel transistor temperature compensation is incorporated into the driver 90 circuitry.

It should be well understood that the specific channel sizes of the MOSFETs shown in FIGS. 4 through 9 and recited herein may be adjusted to achieve various different amplifications of generated currents and voltages without deviating from the spirit of the present invention.

Although the embodiment of the present invention shown in FIGS. 4 through 9 utilizes MOSFETs, it is envisioned that the present invention may also be used in connection with other technologies, such as junction FETs (JFETs) or Gallium Arsenide (GaAs).

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A driver for providing binary signals from a data system to a transmission line, the driver comprising:
   a first field-effect transistor (FET) coupled between an output node and ground for conducting current from the output node to ground, the output node being connectable to the transmission line;
   a first input stage for conducting current from a first voltage supply to the gate of the first FET, the first input stage including a voltage sensing amplifier for comparing a reference voltage to the voltage potential of the output node and for controlling the amount of current conducted to the gate of the first FET in response to the comparison; and
   a second input stage for conducting current from the gate of the first FET to ground.

2. A driver according to claim 1, wherein the first FET comprises a first n-channel transistor that has its drain coupled to the output node and its source coupled to ground.

3. A driver according to claim 1, wherein:
   the first input stage comprises a second FET coupled to conduct current from the first voltage supply to the voltage sensing amplifier; and
   the second input stage comprises a third FET coupled to conduct current from the gate of the first FET to ground.

4. A driver according to claim 1, wherein the voltage sensing amplifier comprises:
   fourth and fifth p-channel transistors that have their sources coupled together;
   sixth and seventh n-channel transistors that have their gates and sources coupled together and their drains coupled respectively to the drains of the fourth and fifth p-channel transistors; and
   wherein, the gate of the fourth p-channel transistor is for receiving the reference voltage, the gate of the fifth p-channel transistor is coupled to the output node, and the drain of the sixth n-channel transistor is coupled to the gate of the first FET.

5. A driver according to claim 1, further comprising:
   a temperature compensation circuit coupled to the first and second input stages for adjusting the level of current conducted to the gate of the first FET and the level of current conducted from the gate of the first FET to compensate for variations in temperature.

6. A driver according to claim 5, wherein the temperature compensation circuit comprises:
   an eighth FET coupled to conduct current from the first voltage supply to the voltage sensing amplifier;
   a ninth FET coupled to conduct current from the voltage sensing amplifier to ground; and
   a positive temperature coefficient current generation circuit for adjusting the gate voltages of the eighth and ninth FETs to compensate for variations in temperature.

7. A driver according to claim 6, wherein the positive temperature coefficient current generation circuit comprises:
   a tenth field-effect transistor (FET);
   an eleventh FET having a larger current conducting channel than the current conducting channel of the tenth FET, the eleventh FET having its gate coupled to the gate of the tenth FET;
   a first resistor coupled between a first node that is common with the source of the tenth FET and a second node that is common with the source of the eleventh FET; and
   current generating circuitry for generating and maintaining substantially equal drain currents in the tenth and eleventh FETs.

8. A driver according to claim 6, wherein the temperature compensation circuit further comprises:

a programmable current transfer and modification stage for selectively programming the gate voltages of the eighth and ninth FETs.

9. A driver according to claim 1, further comprising:
an inverter for coupling binary signals from the data system to the first and second input stages.

10. A driver according to claim 1, wherein binary signals are provided to the transmission line with a dynamic signal range in accordance with the backplane transceiver logic (BTL) standard of approximately 1.1 Volts to 2.1 Volts.

11. A driver for providing binary signals from a data system to a transmission line, the driver comprising:
a first n-channel transistor having its drain coupled to an output node and its source coupled to ground, the output node being for connection to the transmission line;
a first input stage for conducting current from a first voltage supply to the gate of the first n-channel transistor in order to switch the first n-channel transistor into a conductive state, the first input stage including a voltage sensing amplifier for comparing a reference voltage to the voltage potential of the output node and for controlling the amount of current conducted to the gate of the first n-channel transistor in response to the comparison;
a second input stage for conducting current from the gate of the first n-channel transistor to ground in order to switch the first n-channel transistor into a non-conductive state; and
a temperature compensation circuit coupled to the first and second input stages for adjusting the level of current conducted to the gate of the first n-channel transistor and the level of current conducted from the gate of the first n-channel transistor to compensate for variations in temperature.

12. A driver according to claim 11, wherein:
the first input stage comprises a second p-channel transistor that has its source-drain circuit coupled between the first voltage supply and the voltage sensing amplifier, the gate of the second p-channel transistor being responsive to binary signals generated by the data system; and
the second input stage comprises a third n-channel transistor that has its drain-source circuit coupled between the gate of the first n-channel transistor and ground, the gate of the third n-channel transistor being responsive to binary signals generated by the data system.

13. A driver according to claim 11, wherein the voltage sensing amplifier comprises:
fourth and fifth p-channel transistors that have their sources coupled together;
sixth and seventh n-channel transistors that have their gates and sources coupled together and their drains coupled respectively to the drains of the fourth and fifth p-channel transistors; and
wherein, the gate of the fourth p-channel transistor is for receiving the reference voltage, the gate of the fifth p-channel transistor is coupled to the output node, and the drain of the sixth n-channel transistor is coupled to the gate of the first n-channel transistor.

14. A driver according to claim 11, wherein the temperature compensation circuit comprises:
an eighth p-channel transistor that has its source-drain circuit coupled between the first voltage supply and the voltage sensing amplifier;
a ninth n-channel transistor that has its drain-source circuit coupled between the voltage sensing amplifier and ground; and
a positive temperature coefficient current generation circuit for adjusting the gate voltages of the eighth and ninth transistors to compensate for variations in temperature.

15. A driver according to claim 14, wherein the positive temperature coefficient current generation circuit comprises:
a tenth field-effect transistor (FET);
an eleventh FET having a larger current conducting channel than the current conducting channel of the tenth FET, the eleventh FET having its gate coupled to the gate of the tenth FET;
a first resistor coupled between a first node that is common with the source of the tenth FET and a second node that is common with the source of the eleventh FET; and
current generating circuitry for generating and maintaining substantially equal drain currents in the tenth and eleventh FETs.

16. A driver according to claim 14, wherein the temperature compensation circuit further comprises:
a programmable current transfer and modification stage for selectively programming the gate voltages of the eighth p-channel transistor and the ninth n-channel transistor.

17. A driver according to claim 11, further comprising:
an inverter for coupling binary signals from the data system to the first and second input stages.

18. A driver according to claim 11, wherein binary signals are provided to the transmission line with a dynamic signal range in accordance with the backplane transceiver logic (BTL) standard of approximately 1.1 Volts to 2.1 Volts.

* * * * *